(12) United States Patent
Dehaan et al.

(10) Patent No.: US 6,466,009 B1
(45) Date of Patent: Oct. 15, 2002

(54) FLEXIBLE PRINTED CIRCUIT MAGNETIC FLUX PROBE

(75) Inventors: James M. Dehaan, Denver, CO (US); Malin Lester Jocobs, Littleton, CO (US); Umberto Milano, Littleton, CO (US)

(73) Assignee: The United States of America as represented by the Secretary of the Interior, Washington, DC (US)

( * ) Notice: Subject to any disclaimer, the term of this patent is extended or adjusted under 35 U.S.C. 154(b) by 0 days.

(21) Appl. No.: 09/874,233

(22) Filed: Jun. 6, 2001

(51) Int. Cl.[7] .................................................. G01B 7/14
(52) U.S. Cl. .................. 324/207.11; 310/184; 324/72.5
(58) Field of Search ........................... 324/72.5, 207.11, 324/207.12–207.24; 310/90.5, 184; 360/98.08; 73/862.08, 862.333

(56) References Cited

U.S. PATENT DOCUMENTS 6,025,973 A * 2/2000 Mizoshita et al. ....... 360/98.08

* cited by examiner

*Primary Examiner*—N. Le
*Assistant Examiner*—Amy He
(74) *Attorney, Agent, or Firm*—Ross F. Hunt, Jr.

(57) ABSTRACT

A flexible probe is provided for detecting time-varying magnetic fields produced in an electric generator. The flexible probe is adapted to be disposed within an air gap formed between an iron stator and a rotatable rotor. An electrostatic shield layer is formed on a front face of the probe and a printed circuit forming at least one coil is printed on the back face. When the flexible probe is used for detecting time-varying magnetic fields, a voltage is induced in the coil when the coil is exposed to a time-varying magnetic field.

20 Claims, 2 Drawing Sheets

FLEXIBLE PRINTED CIRCUIT MAGNETIC FLUX PROBE

STATEMENT REGARDING FEDERALLY SPONSORED RESEARCH

This invention was made by employees of the United States Government and may be manufactured and used by or for the Government for governmental purposes without the payment of any royalties.

BACKGROUND OF THE INVENTION

1. Field of the Invention

The present invention relates to a probe for measuring magnetic flux and in particular, a probe for measuring time-varying magnetic fields produced in electric generators between the rotor poles and an iron stator.

2. Background of the Invention

A typical electric generator consists of a rotatable rotor and a stationary iron stator. An air gap is formed between the rotor and the stator. Electricity is generated as the rotor rotates relative to the iron stator. As the rotor rotates, substantial air currents, i.e., wind, are typically created.

A time-varying magnetic field (i.e., flux) is produced in the air-gap. The time-varying magnetic fields may be used to assess the health or status of the generator. For example, time-varying magnetic fields may indicate the existence of rotor shorted turns resulting from insulation failure between the individual windings of the electrical generator. Therefore, it can be advantageous to measure the time-varying magnetic fields produced in the air-gap.

One commercially available, conventional probe for measuring air-gap magnetic flux in electric generator employs a custom-wound wire coil. A second conventional available probe comprises a non-flexible, epoxy-encased probe. Both of these conventional probes tend to be relatively thick and massive and are mounted onto the surface of the stator. A voltage is generated in the probe by the magnetic field as the rotor rotates.

Conventional probes typically include a solid ground plane shield. The solid ground plane shield produces ground-loop-induced currents (i.e., eddy currents) when disposed in the air-gap of an electrical generator during operation. The ground-loop-induced currents can interfere with magnetic flux measurements.

One disadvantage with conventional commercial probes is that the probes are of size and mass that makes them susceptible to becoming unmounted by the considerable wind force generated in the air-gap by the rotating rotor. Consequently, these conventional probes can be dislodged and swept away inside the electric generator. Such dislodged or unmounted probes pose a potential damage threat to the generator.

A second disadvantage of conventional probes is that individual probes require calibration. Since conventional probes tend to be custom-wound coils of wire, calibration is necessary to ensure consistency in time-varying magnetic field detection. Thus, there is a cost associated with implementation of conventional probes to detect time-varying magnetic fields resulting from the necessary calibration steps.

As indicated above, an additional disadvantage with conventional probes is that the conventional ground-plane shield results in ground-loop-induced currents and, as stated, these induced currents affect the accuracy of measuring a magnetic flux present in the air-gap.

BRIEF SUMMARY OF THE INVENTION

In accordance with the present invention, a flexible magnetic flux probe detects time-varying magnetic fields produced in the air-gap of an electric generator. The probe comprises a shield layer on a front layer and a printed circuit coil on the back layer. The flexible probe is adapted to be removably affixed to a stator of an electric generator. A time-varying magnetic field is detected by the probe as variations in voltage induced in the printed circuit coil during the electric motor operation (i.e., as the rotor spins).

According to one aspect of the invention, a flexible probe is provided for detecting time-varying magnetic fields produced in an electric generator. The electric generator has a rotor, an iron stator, and an air-gap formed therebetween. The flexible probe includes a flexible substrate having a front side and a back side. An electrostatic shield layer is formed on the front side of the substrate. A printed circuit having at least one coil (i.e., turn) is formed on the back side. A voltage is induced in the coil when the coil is exposed to a time-varying magnetic field. In one embodiment of the present invention, the electrostatic shield layer comprises traces of conductive material spaced parallel with gaps therebetween printed on the front side. The traces are connected together at one end.

According to another aspect of the invention, a device is provided for detecting time-varying magnetic fields in a system which includes an electric generator having a rotatable rotor, an iron stator, and an air-gap formed therebetween for producing the time-varying magnetic field when the rotor rotates. The device comprises a flexible printed circuit probe having a front side and a back side. The front side has an electrostatic shield formed thereon. The back side has a printed circuit coil layer formed thereon which includes at least one coil. The probe is removably fixable to the stator with the shield layer facing the rotor and the printed circuit layer facing the stator. A voltage is induced in the coil when the coil is exposed to a time-varying magnetic field.

According to yet another aspect of the invention, a method is provided for detecting time-varying magnetic fields in an electric generator having a rotatable rotor, an iron stator, and an air-gap formed therebetween which produces the magnetic fields when the rotor rotates. The method includes providing a flexible printed circuit probe having a front side and a back side in which the front side has an electrostatic shield layer formed thereon. The back side has a printed circuit coiled layer formed thereon and includes at least one coil. The flexible printed circuit probe is removably affixed onto the stator with the shield layer facing the rotor and the printed circuit layer facing the stator. The voltage generated in the printed circuit coil is then detected when the rotor rotates relative to the stator thereby responsive to inducing a voltage in the printed circuit coil layer.

An important feature of the present invention relates to the use of a flexible printed circuit board as a probe for detecting time-varying magnetic fields in the air-gap of an electric generator. This provides important advantages discussed in more detail hereinbelow.

Another feature of the present invention relates to the use of a simulated ground plane as a shield in a probe for detecting time-varying magnetic fields. The simulated ground shield is formed as printed traces of a conducting material spaced parallel with gaps therebetween and connected at one end. An important advantage of the simulated ground plane is that it reduces or prevents a ground-loop-induced current typically occurring in ground-plane shields of conventional probes used to detect air-gap magnetic fields.

Yet another important feature of the present invention relates to the use of low-cost multiple layer flexible printing circuit technology in producing a flexible probe that is inexpensive and disposable.

A further feature of the present invention is that the invention permits manufacturing technology that produces probes having uniform electrical and magnetic characteristics. As a result, these probes do not require calibration, thereby allowing the probes to be used in various locations within a machine with assurance of consistency between probes.

Still further advantages of the present invention result from the provision of a relatively thin, light and flexible probe. If the probe should become unmounted or otherwise separated from the stator, the thin, light and flexible probe is unlikely to cause damage to the electric generator. In this regard, the very low mass flexible substrate provides more flexibility in the probe mounting and contributes to the reduction or elimination of possible machine damage in the unlikely event that the probe should become unmounted.

Further features and advantages of the present invention will be set forth in, or apparent from, the detailed description of preferred embodiments thereof which follows.

DETAILED DESCRIPTION OF THE INVENTION

Figure 1:
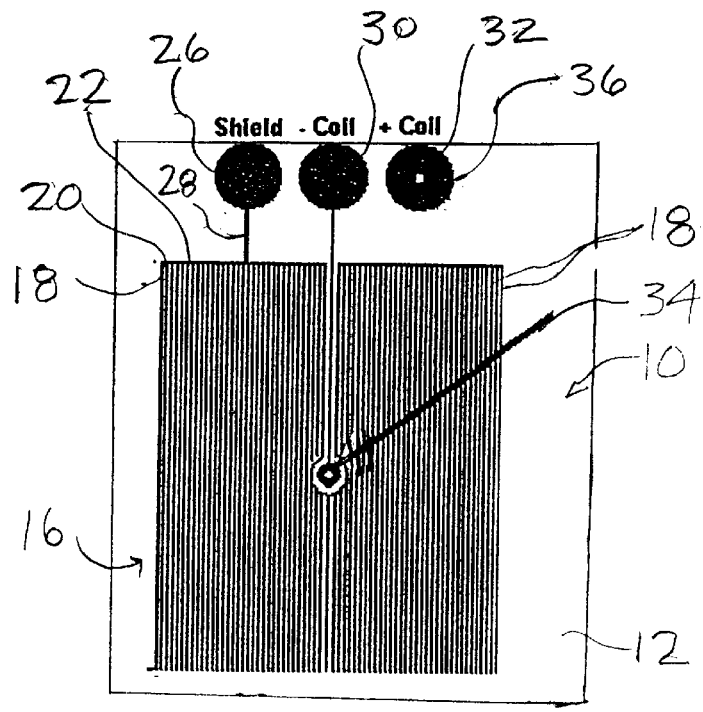
FIG. 1 is a schematic top plan view illustratively depicting the front side of a probe according to a preferred embodiment of the present invention.

Referring now to the figures, and in particular to FIG. 1, illustratively depicted therein is probe 10. Probe 10 is composed of a flexible substrate material forming a front side (layer) 12 and a back side (layer) 14 (see FIG. 2). An electrostatic shield 16 is printed on front side and comprises a plurality of parallel traces 18 with gaps 20 formed therebetween. A transverse tracing 22 electrically connects together the ends of the parallel traces 18.

As will be apparent to those skilled in the art, electrostatic shield 16 forms a simulated ground plane electrostatic shield. The design of shield 16 reduces any induced circulating current to near zero using similar principles to those involved in laminating a machine core to reduce eddy currents in the core material. Shield 16 achieves nearly the same effectiveness as a conventional solid ground plane but without a ground-loop-induced current such as would occur in a conventional ground-plane shield of an air-gap probe.

A shield terminal 26 is electrically connected to shield 16 by a trace line 28. Shield terminal 26 is then connected to electrical ground when probe 10 is deployed to detect time-varying magnetic fields in an electrical generator.

A negative coil terminal 30 and a positive coil terminal 32 are also provided on front side 12. Negative coil terminal 30 and positive coil terminal 32 are electrically connected to a printed circuit coil formed on back side 14 by plated through holes 34 and 36, respectively.

Figure 2:
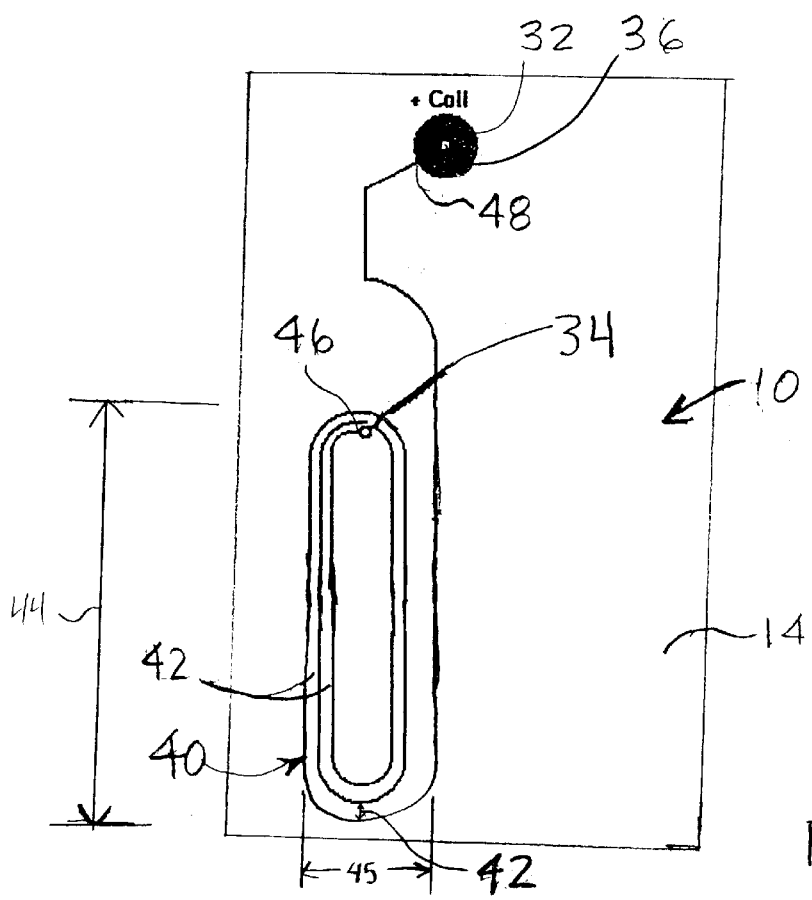
FIG. 2 is a schematic bottom plan view illustratively depicting the back side of the probe of FIG. 1.

Referring now to FIG. 2, the back side 14 of probe 10 includes a printed circuit coil 40. Printed circuit coil 40 is printed on back layer 14 using any conventional printed circuit board printing method known in the art. Printed circuit coil 40 comprises a multiple turn trace with spaces 42 defined between adjacent sections of the coil. The size of spaces 42 is determined based upon the application in which probe 10 is to be used. Similarly, the number of turns of printed circuit coil 40 is selected based upon the desired application in which probe 10 is to be employed and the length 44 and width 45 of coil 40 is also determined based upon the application in which probe 10 is to be used.

An induced voltage will be produced in printed circuit coil 40 as printed circuit coil 40 is exposed to time-varying lines of force of a magnetic field. The induced voltage in coil 40 may be measured by any suitable conventional instrumentation connected to coil negative terminal 30 and positive coil terminal 32.

The end of the first turn 46 of coil 40 is connected to negative coil terminal 30 via plated through hole 34 while the end of the last turn 48 is connected to positive coil terminal 32 through plated through hole 36.

Figure 3:
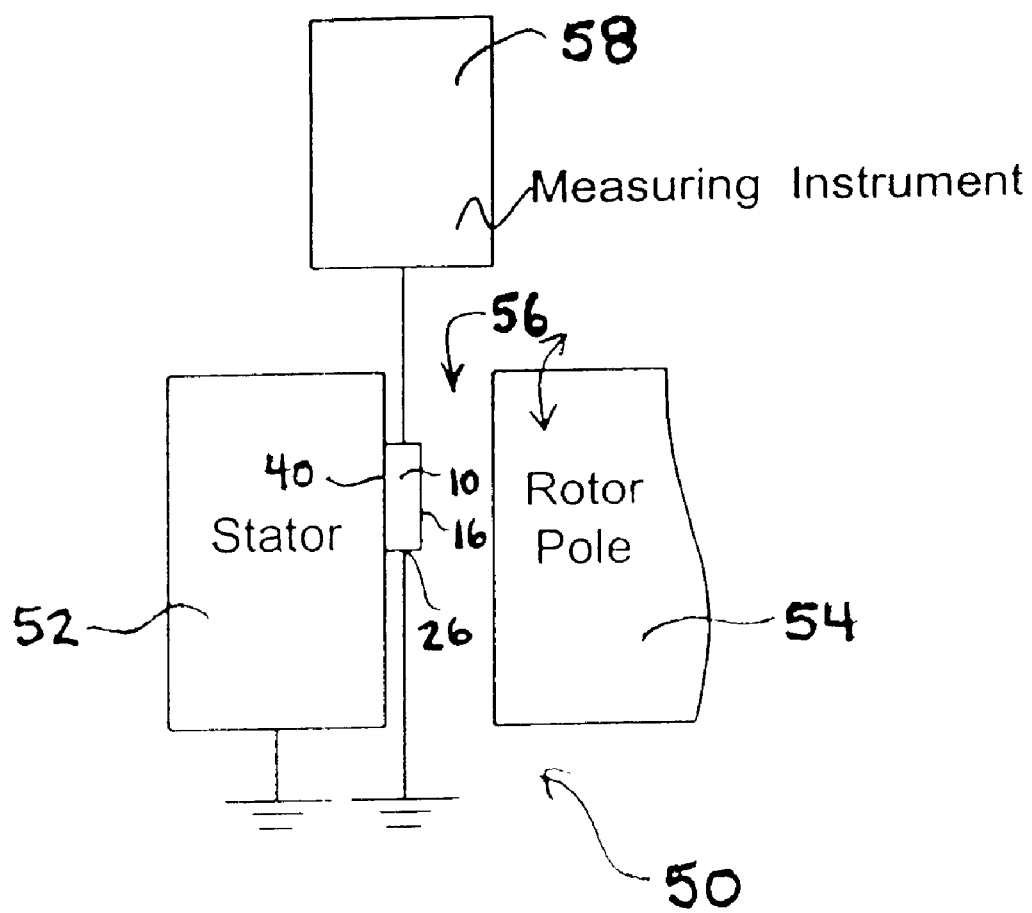
FIG. 3 is a squematic diagram illustrating a system for detecting time-varying magnetic fields in an electric generator according to a preferred embodiment of the present invention.

To facilitate a better understanding of how flexible probe 10 may be used to detect time-varying magnetic fields, FIG. 3 depicts in a highly schematic manner, flexible probe 10 disposed within a conventional electrical generator 50. Electrical generator 50 includes iron stator 52 and rotor pole 54 and rotor pole 54 rotates (i.e., spins) relative to the stationary iron stator 52. An air-gap 56 is formed between stator 52 and rotor 54. Stator 52 is electrically grounded. As is well known, a time-varying magnetic field is generated as a result of direct current in rotor 54 and the rotation of rotor 54 relative to stator 52.

Flexible probe 10 is removably secured to stator 52 by adhesive with the printed circuit coil 40 facing the stator 52 and the shield 16 facing the rotor 54. Shield terminal 26 is connected to electrical ground. A suitable measuring instrument 58 is connected to the positive and negative coil terminals (corresponding to terminals 34, 36) and measures induced voltage in coil 40. In addition, the instrumentation 58 is used to record and/or process the magnetic field data.

It will be appreciated that the printed circuit coil 40 is effectively surrounded by grounded conductors, viz., stator 52 on one side and the probe shield 16 on the other side. This shielding prevents changing electrical fields in electric generator 50 from influencing magnetic measurements to be taken by instrument 58.

The grounded stator 52 eliminates the need for a second shield layer to be built into probe 10. As a result, there is a reduction in complexity and cost associated with manufacturing the probe 10.

The theory of operation of probe 10 will be apparent to one of skill in the art. Probe 10 operates under the same theory as a magnetic probe made of a coil of wire. As lines of force of the magnetic field cut the turns of printed circuit coil 40, a voltage is induced in printed circuit coil 40. The voltage is proportional to the rate-of-change of flux in the magnetic field, the number of turns, and the cross-sectional area of the turn in the printed circuit coil 40. A single-layer coil topology dictates that the coil will be in the form of a spiral, with each turn having a different cross-sectional area.

The relationship between these variables can be expressed as:

$$e \propto NA\frac{d\varphi}{dt} \text{ where}$$

$e$ is the induced voltage, $N$ is the number of turns, $A$ is the average turn cross sectional area, and $d\varphi/dt$ is the rate of change of magnetic flux.

As indicated above, flexible probe 10 provides important advantages over conventional magnetic flux detecting probes. Probe 10 may be made thin (e.g., less than 0.01 inches), light (e.g., under 0.5 ounces), and flexible. Due to the low mass and flexibility therein, probe 10 limits any potential damage which may occur to electrical generator 50 in the unlikely event that probe 10 should separate from stator 52 during operation of electrical generator 50.

Further, the manufacturing process of forming coil 40 as a printed circuit allows for inherent precision to ensure that all probes formed by this manufacturing method will have the same design. As a result, all probes will essentially have identical physical, electrical and magnetic characteristics regardless of the manufacturing production run.

Although the invention has been described above in relation to preferred embodiments thereof, it will be understood by those skilled in the art that variations and modifications can be effected in these preferred embodiments without departing from the scope and spirit of the invention.

What is claimed is:

1. A flexible probe for detecting time-varying magnetic fields produced in an electric generator having a rotor, an iron stator and an air-gap formed therebetween, said flexible probe comprising:
   a flexible substrate having a front side and a back side;
   an electrostatic shield layer formed on said front side of side substrate; and
   a printed circuit forming at least one coil on said back side having a voltage induced when said at least one coil is exposed to a time-varying magnetic field.

2. The flexible probe of claim 1, further comprising a shield terminal conductively associated with said shield layer and adapted to be electrically connected to electrical ground.

3. The flexible probe of claim 1, further comprising a positive terminal and a negative terminal electrically associated with said printed circuit and disposed on said front side.

4. The flexible probe of claim 3, wherein said flexible probe further comprises an aperture through said flexible substrate thereby providing a plated through hole between said shield layer and said printed circuit for accommodating electrical connectivity of said positive terminal and said negative terminal to said printed circuit.

5. The flexible probe of claim 1, further comprising a protective coating layer covers said shield layer and said printed circuit.

6. The flexible probe of claim 1, wherein said shield layer comprises a simulated ground plane printed on said front side, substantially overlaying said printed circuit formed on said back side.

7. The flexible probe of claim 6, wherein said simulated ground plane comprises printed traces of conductive material spaced parallel with gaps therebetween, said traces are connected together at one end.

8. In an electric generator system having a rotatable rotor, an iron stator and an air-gap formed therebetween, for producing a time-varying magnetic field when said rotor rotates, and a device for detecting said time-varying magnetic fields, said device comprising:
   a flexible printed circuit probe having a front side and a back side, said front side having an electrostatic shield layer formed thereon, said back side having a printed circuit coil layer formed thereon and including at least one coil, said probe removable affixable to said stator with said shield layer facing said rotor and said printed circuit layer coil layer facing said stator, said coil having a voltage induced when said coil is exposed to a time-varying, magnetic field.

9. The system of claim 8, wherein said flexible probe further comprises:
   a shield terminal conductively associated with said shield layer and disposed on said front layer; and
   a positive terminal and a negative terminal electrically associated with said coil layer and disposed on said front layer.

10. The system of claim 9, wherein said probe further comprises an aperture through said flexible printed circuit probe thereby providing a plated through hole between said shield layer and said coil layer for accommodating electrical connectivity of said positive terminal and said negative terminal to said coil layer.

11. The system of claim 8, wherein said shield layer is connected to electrical ground.

12. The system of claim 8, wherein said shield terminal is connected to electrical ground.

13. The system of claim 8, further comprising an instrument for processing magnetic field data and operatively associated with said flexible printed circuit probe.

14. The system of claim 9, further comprising an instrument for processing magnetic field data and operatively associated with said positive terminal and said negative terminal.

15. The system of claim 8, wherein said shield layer comprises a simulated ground plane printed on said front layer, substantially overlaying said printed circuit formed on said back layer.

16. The system of claim 15, wherein said simulated ground plane comprises traces of conductive material spaced parallel with gaps therebetween, said traces are connected together at one end.

17. A method for detecting time-varying magnetic fields in an electric generator having a rotatable rotor, an iron stator and an air-gap formed therebetween, which produces the magnetic field when the rotor rotates, said method comprising the steps of:
   providing a flexible printed circuit probe having a front side and a back side in which the front layer has an electrostatic shield layer formed thereon, and the back side has a printed circuit coil layer including at least one coil formed thereon;
   removably affixing the flexible printed circuit probe onto the stator with the shield layer facing the rotor and the printed circuit layer facing the stator; and
   detecting the voltage generated in the printed circuit coil layer when the rotor rotates relative to the stator thereby inducing a voltage in the printed circuit coil layer.

18. The method of claim 17, wherein the electrostatic shield layer is formed by printing traces of conductive material spaced parallel with gaps therebetween and connecting the traces together at one end.

19. The method of claim 17, wherein said step of providing a flexible printed circuit probe further comprises:

forming a shield terminal conductively associated with said shield layer and connected to electrical ground;

forming a positive terminal and a negative terminal on said front layer and electrically associated with the coil layer; and providing a plated through hole between the shield layer and the coil layer for accommodating electrical connectivity of the positive terminal and the negative terminal to the printed circuit coil.

20. The method of claim 18, wherein said step of providing a flexible printed circuit probe further comprises:

forming a shield terminal conductively associated with said shield layer and connected to electrical ground;

forming a positive terminal and a negative terminal on said front layer and electrically associated with the coil layer; and providing a plated through hole between the shield layer and the coil layer for accommodating electrical connectivity of the positive terminal and the negative terminal to the printed circuit coil.

* * * * *